United States Patent [19]

De Francesco

[11] Patent Number: 5,733,511
[45] Date of Patent: Mar. 31, 1998

[54] POWER DISTRIBUTION FOR MULTIPLE ELECTRODE PLASMA SYSTEMS USING QUARTER WAVELENGTH TRANSMISSION LINES

[75] Inventor: Frank De Francesco, Palo Alto, Calif.

[73] Assignee: The BOC Group, Inc., Murray Hill, N.J.

[21] Appl. No.: 563,881

[22] Filed: Nov. 21, 1995

Related U.S. Application Data

[63] Continuation of Ser. No. 263,283, Jun. 21, 1994, abandoned.

[51] Int. Cl.$^6$ .................................................. B01J 19/08
[52] U.S. Cl. ................ 422/186.05; 422/907; 118/723 R; 118/723 E
[58] Field of Search .................. 422/186, 186.85, 422/907; 118/715, 723 R, 723 E; 315/111.21

[56] References Cited

U.S. PATENT DOCUMENTS

| | | | |
|---|---|---|---|
| 3,347,772 | 10/1967 | Laegreid et al. | 204/298 |
| 3,471,396 | 10/1969 | Davidse | 304/298 |
| 3,525,680 | 8/1970 | Davidse et al. | 204/192 |
| 3,616,405 | 10/1971 | Beaudry | 204/192 |

(List continued on next page.)

FOREIGN PATENT DOCUMENTS

| | | |
|---|---|---|
| 2383552 | 10/1978 | France . |
| 4112590 | 10/1991 | Germany . |
| 4242894 | 6/1994 | Germany . |
| WO 89/02695 | 3/1989 | WIPO . |

OTHER PUBLICATIONS

Technology Topics, "Sputter Etch Using RF Rotary Planetary Tooling".

"Electrical Characterization of Radio–Frequency Sputtering Gas Discharge", J.S. Logan, N.M. Mazza & P.D. Davidse, Journal of Vacuum Science & Technology (US), vol. 6, No. 1, pp. 120–123.

"Automatic Impedance Matching System for RF Sputtering", N.M. Mazza, IBM Journal Research & Development (US), vol. 11, No. 2 (2 pages), Mar. 1970.

"RF Biasing Through Capacitive Collector to Target Coupling in RF Diode Sputtering", O. Christensen & P. Jensen, Journal of Physics Part E (GB), vol. 5, No. 1 (5 pages), Jan. 1972.

"Ultra–Stable System for RF Sputtering with RF–Induced Substrate Bias", J.L. Vossen & J.J. O'Neill, Jr., Journal of Vacuum Science & Technology (US), vol. 12, No. 5, pp. 1052–1057, Sep./Oct. 1975.

"Impedance Matching Circuit for RF Sputtering Systems", W.B. Pennebaker, IBM Technical Disclosure Bulletin (US), vol. 19, No. 7, pp. 2809–2810, Dec. 1976.

"Experimental and Design Information for Calculating Impedance Matching Networks for Use in RF Sputtering and Plasma Chemistry", H. Norström, Vacuum (GB), vol. 29, No. 10, pp. 341–350, (Received for Publication Jun. 8, 1979)

"A.A.R.L. Antenna Book", American Radio Relay League, Inc., 1960, pp. 67–80, 100–113.

Primary Examiner—Charles T. Jordan
Assistant Examiner—Daniel Jenkins
Attorney, Agent, or Firm—David A. Draegert; Salvatore P. Pace

[57] ABSTRACT

A multiple electrode plasma reactor power splitter and delivery system to provide balanced power to a plurality of powered electrodes by utilizing the properties of quarter wave length transmission lines. Each electrode is supplied power by a separate $(2N+1)\lambda/4$ wavelength cable, where $N=0,1,2\ldots$, connected to a common point at a load matching network's output. The impedance transformation properties of these lines are also employed to convert the plasma load to one that is more efficiently matched into by a standard network. Also disclosed is a technique of splitting a single large active electrode into smaller active electrodes powered by the above distribution scheme in order to achieve maximum uniformity of the reactive plasma throughout the working volume.

7 Claims, 2 Drawing Sheets

U.S. PATENT DOCUMENTS

| | | | |
|---|---|---|---|
| 3,653,766 | 4/1972 | Walters et al. | 356/86 |
| 3,767,551 | 10/1973 | Lang, Jr. et al. | 204/192 |
| 4,129,839 | 12/1978 | Galani et al. | 333/9 |
| 4,254,386 | 3/1981 | Nemit et al. | 333/128 |
| 4,282,077 | 8/1981 | Reavill | 204/192.32 |
| 4,310,814 | 1/1982 | Bowman | 333/121 |
| 4,337,415 | 6/1982 | Durr | 315/111.51 |
| 4,351,714 | 9/1982 | Kuriyama | 204/298 |
| 4,381,965 | 5/1983 | Maher, Jr. et al. | 156/345 |
| 4,482,246 | 11/1984 | Meyer et al. | 356/316 |
| 4,609,808 | 9/1986 | Bloyet et al. | 219/121 PR |
| 4,611,108 | 9/1986 | Leprince et al. | 219/121 PR |
| 4,664,890 | 5/1987 | Tawada et al. | 422/186.05 |
| 4,704,301 | 11/1987 | Bauer et al. | 427/38 |
| 4,724,296 | 2/1988 | Morley | 219/121 PT |
| 4,887,005 | 12/1989 | Rough et al. | 315/111.21 |
| 4,930,035 | 5/1990 | Viana et al. | 361/54 |
| 5,006,760 | 4/1991 | Drake, Jr. | 315/111.21 |
| 5,077,499 | 12/1991 | Oku | 315/111.21 |
| 5,111,024 | 5/1992 | Patron et al. | 219/121.54 |
| 5,111,111 | 5/1992 | Stevens et al. | 315/111.41 |
| 5,128,602 | 7/1992 | Carter | 323/267 |
| 5,140,223 | 8/1992 | Gesche et al. | 315/111.21 |
| 5,180,949 | 1/1993 | Durr . | |
| 5,210,466 | 5/1993 | Collins et al. | 315/111.21 |
| 5,262,610 | 11/1993 | Huang et al. | 219/121.43 |
| 5,433,813 | 7/1995 | Kuwabara | 156/345 |
| 5,556,501 | 9/1996 | Collins et al. | 156/345 |
| 5,565,738 | 10/1996 | Samukawa et al. | 315/111.51 |

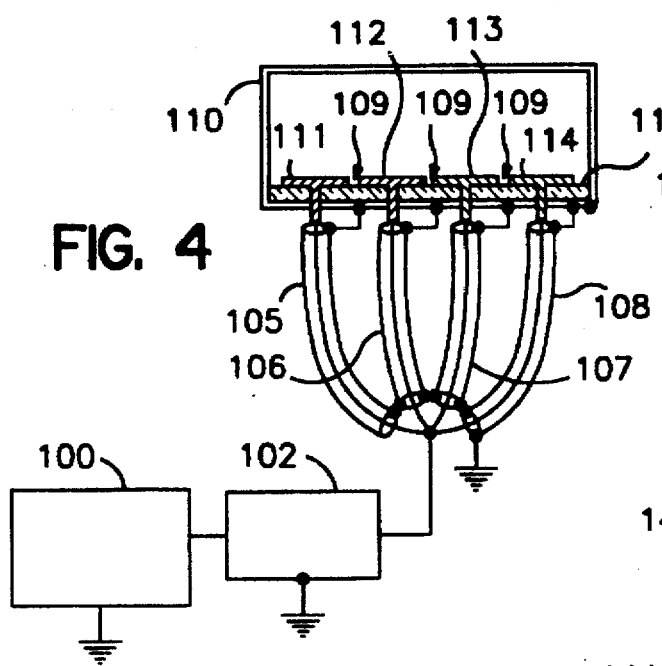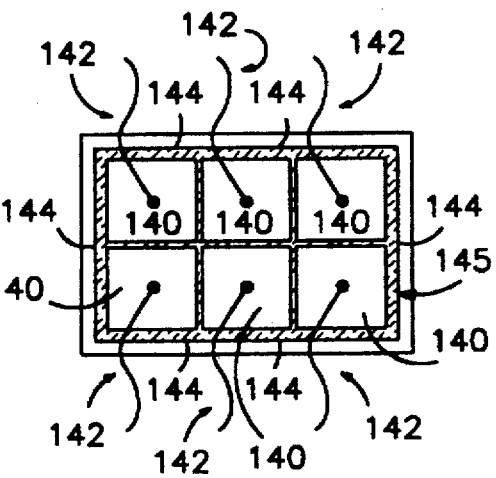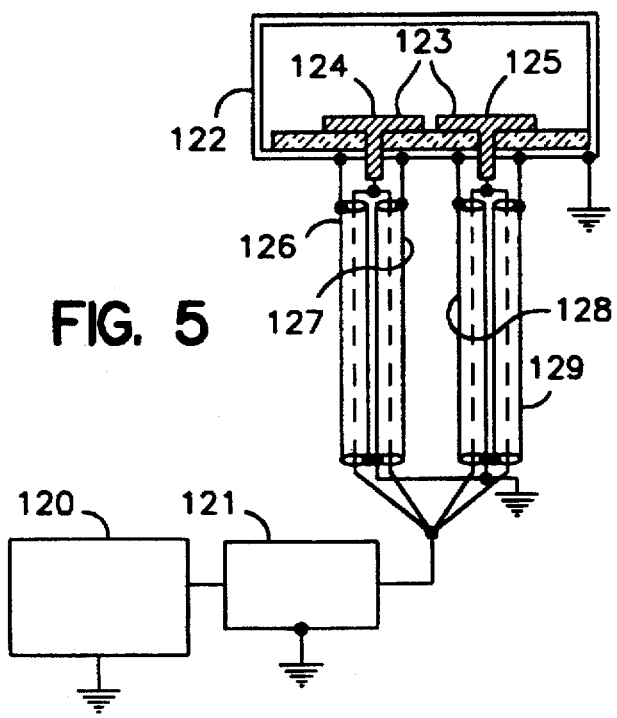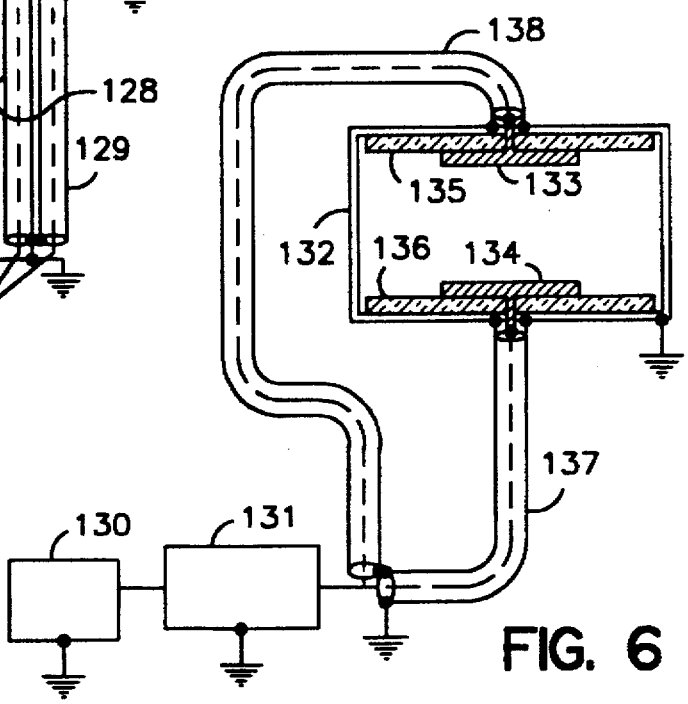

POWER DISTRIBUTION FOR MULTIPLE ELECTRODE PLASMA SYSTEMS USING QUARTER WAVELENGTH TRANSMISSION LINES

This is a continuation of application Ser. No. 08/263,283, filed Jun. 21, 1994 now abandoned.

BACKGROUND OF THE INVENTION

1. Field of the Invention

The present invention relates generally to devices and methods for supplying power to electrodes in plasma reactor systems and more particularly to a RF power distribution device and method utilizing ¼ wavelength transmission lines engaged to each of a plurality of powered electrodes such that power to each electrode is equalized.

2. Description of the Prior Art

Multiple electrode configurations are advantageous in larger plasma reactors in order to obtain a more uniformly excited plasma throughout the reactor volume. However, the equal distribution of energy to each electrode is not easily accomplished. These issues are discussed in U.S. Pat. Nos. 4,381,965, 4,664,890 and 4,887,005. U.S. Pat. Nos. 4,381,965 and 4,664,890 deal with methods of equalizing reactor electrode impedances through external adjustable reactive elements to achieve a uniform power distribution among electrodes. One disadvantage of this technique is that it only equalizes the impedances at some single plasma condition of gas type, pressure, temperature, power, etc.

U.S. Pat. No. 5,077,499 concerns maximizing power delivery efficiency by use of shorted stub tuning or lumped elements to better match the reactor impedance to the transmission line impedance. There is no mention of multiple electrodes with their attendant power splitting issues.

As plasma reactor chambers are scaled up in size, the electrode area has necessarily increased with a resulting decrease in electrode impedance. This compounds the difficulty of matching the RF generator to the reactor chamber load and results in higher resistive losses due to high currents in the electrode feed lines and matching network. In a reactor with a plurality of powered electrodes, equalization of the power delivered to each electrode element also becomes more difficult because of the unequal impedances of the individual power feed lines. In U.S. Pat. No. 4,887,005, Rough describes a method of power distribution which equalizes the power delivered to multiple electrode systems. In an N electrode reactor this method requires N-1 coils arranged in a binary tree structure with all the RF current flowing through the first coil which can become very hot, and may require water cooling. For a large number of electrodes, multiple levels of coils are required with some power loss in each level. The load seen by the match network is the parallel combination of all the electrode impedances plus considerable stray inductance from the long leads that are required in a large reactor system; thus all the electrode currents are summed at the match network. This characteristic sometimes necessitates the use of high current components in the match network and their attendant costs. Another disadvantage is the requirement for $2^N$ electrodes if one wishes to distribute RF energy equally among all of the electrodes.

SUMMARY OF THE INVENTION

The present invention is intended to solve the problems detailed above and to provide a plasma reactor electrode arrangement which creates a large active electrode area which has uniform plasma properties over the extent of the surface of the electrode.

To achieve uniform plasma distributions in plasma chambers that have multiple powered electrodes, optimized transmission lines are utilized wherein the length of each transmission line is an odd multiple of ¼ of the wavelength of the voltage propagating within the transmission line. The effect of a large electrode having a uniform plasma distribution across its surface is created by utilizing a plurality of electrode segments that are powered with equal length ¼ wavelength transmission lines. Alternative embodiments utilize two or more transmission lines to each electrode to facilitate impedance matching, and odd multiples of ¼ wavelength transmission lines, that differ in length by odd multiples of ½ wavelength are utilized to differentially excite opposed electrode configurations.

The foregoing and other objections, features and advantages of the present invention will be apparent from the following description of the preferred embodiments which make reference to the several figures of the drawings.

DESCRIPTION OF THE DRAWINGS

FIG. 4 is a partly schematic and partly pictorial representation of one preferred embodiment depicting a chamber having the electrode split into four segments and fed by a like number of ¼ wavelength transmission lines;

FIG. 4a shows an alternate embodiment of FIG. 1 used to allow independent electrode DC bias;

FIG. 5 illustrates a method of utilizing multiple transmission lines in parallel to obtain a low characteristic impedance;

FIG. 6 depicts a technique whereby the differential excitation of electrodes can be achieved by using transmission line lengths that differ by a length of ½ wavelength; and FIG. 7 depicts a plurality of relatively small electrodes that are disposed to function as one relatively large electrode having a uniform plasma distribution throughout the surface thereof.

DETAILED DESCRIPTION OF THE PREFERRED EMBODIMENTS

Figure 1:
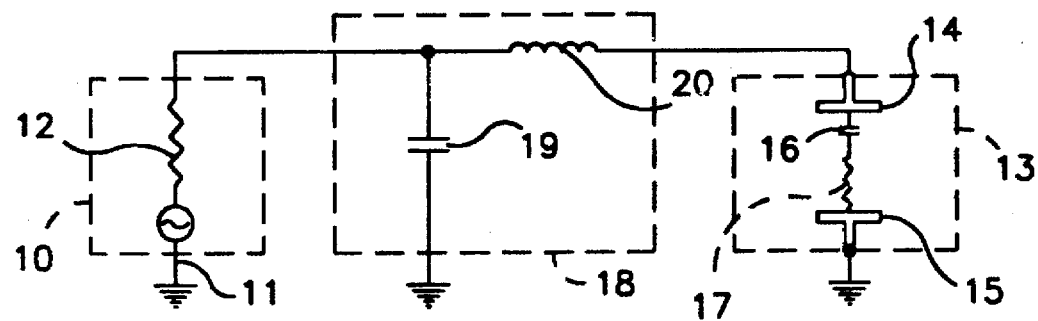
FIG. 1 depicts a standard high frequency generator and match network such as is used in the prior art and a reactor chamber with equivalent circuit components.

It is desirable to achieve a controlled, uniform plasma across a plurality of powered electrodes within a plasma chamber. When such a uniform plasma is created, the plurality of electrodes may be arranged to act as one large electrode that has a uniform plasma across its entire face. This invention achieves such a uniformly powered plurality of electrodes by providing equal current to each powered electrode and also a favorable impedance transformation by using ¼ wavelength transmission lines radiating from the output of a standard matching network to each one of the electrodes in a plasma reactor. A ¼ wavelength transmission line is a transmission line (such as coaxial cable) having a length that is equal to ¼ of the wavelength of the voltage that is propagating within the transmission line. However, in this application the definition of the phrase "¼ wavelength transmission line" shall be extended to also include transmission lines having a length that is equal to any odd multiple of one fourth of the wavelength of the voltage that is propagating within the transmission line; that is, generally, $(2N+1)\lambda/4$ where $\lambda$ is the wavelength of the voltage propagating through the line and $N=0,1,2,\ldots$ For a plurality of electrodes that are powered in-phase, it is therefore to be understood that acceptable transmission line lengths would be $\lambda/4$, $\lambda+\lambda/4$, and generally $k\lambda+\lambda/4$ where $k=0,1,2\ldots$ Additionally, in-phase power distribution is likewise achieved by using a plurality of transmission lines having a length $3\lambda/4$, $\lambda+3\lambda/4$, and generally $L\lambda+3\lambda/4$ where $L=0,1,2\ldots$ The significant feature for in-phase electrode power distribution is that each of the transmission lines have an equivalent length with regard to the phase of the voltage that is supplied to the electrode, and, as stated above, the length of such transmission lines is defined herein to be a ¼ wavelength transmission line. The following brief analysis is provided to demonstrate the advantages associated with the use of the ¼ wavelength transmission line.

A ¼ wave lossless transmission line changes a load impedance $Z_{load}$ at one end to $Z_{char}^2/Z_{load}$ at the other end, where $Z_{char}$ is the transmission line characteristic impedance. If we assume $Z_{load}$ is comprised of the complex impedance x−jy, then the load looking into the transmission line becomes:

$$Z_{source} = \frac{Z_{char}^2}{Z_{load}} = \frac{Z_{char}^2}{x-jy} \qquad \text{Eq. (1)}$$

Solving to obtain real and imaginary terms:

$$Z_{source} = \frac{Z_{char}^2}{x^2+y^2}(x+jy) \qquad \text{Eq. (2)}$$

If we apply a voltage V at the end opposite end of the line from the load then the power fed into the line will be:

$$\text{Power} = I^2R = \left(\frac{V}{|Z_{source}|}\right)^2 Re(Z_{source}) = \qquad \text{Eq. (3)}$$

$$\frac{V^2}{\left|Z_{char}^2 \frac{(x+jy)}{x^2+y^2}\right|^2} Z_{char}^2 \frac{x}{x^2+y^2}$$

where $Re(Z_{source})$ is the real component of transformed load impedance. This simplifies to:

$$\left(\frac{V}{Z_{char}}\right)^2 x \qquad \text{Eq. (4)}$$

Since the power at the load end must equal the power into the opposite end of a lossless line, we can write the following equality:

$$I_{load}^2 x = \left(\frac{V}{Z_{char}}\right)^2 x \qquad \text{Eq. (5)}$$

or $$I_{load} = \frac{V}{Z_{char}} \qquad \text{Eq. (6)}$$

Here we see that the load current depends only on the voltage feeding the other end of the transmission line and the line's characteristic impedance. Therefore, multiple ¼ wavelength lines with one of their ends connected to a common voltage node, in this case the output of a matching network, will all supply equal currents at their other end independent of the impedances of the terminations. Thus, differences in feedline impedances to a plurality of electrodes have minimal effect on the power splitting to the electrodes.

The impedance transforming properties of ¼ wavelength transmission lines can be used to increase the characteristic plasma impedance to a value which is more favorable to the matching network to both reduce the current stress and thus power losses and cost of this element of the system. If power were delivered to a multitude of electrodes without impedance transformation, the lead to the common distribution point would carry the sum of all electrode currents. This can easily be hundreds of amps of RF current in larger systems. The attendant losses and thereby heating become major issues to the system designer. However, the ¼ wavelength transmission line has the impedance transforming properties mentioned above, i.e. the matching network operates into a load consisting of parallel sections of line each presenting a load of $Z_{char}^2/Z_{loadn}$ where $Z_{loadn}$ is the RF impedance of the nth electrode. If the transmission line characteristic impedance is greater than the magnitude of the load's impedance, the effect is to increase the impedance on the end of the ¼ wavelength line into which the match network feeds. This decreases currents and reduces losses and heating in the match network components. From the preceding discussion it can be seen that in order to take advantage of the impedance transform, it is necessary to choose the line's characteristic impedance such that one achieves an increase in the magnitude of load impedance seen at the match network. However, if too large a transformation ratio is chosen the standing waves in the transmission line will be excessive and lead to a higher loss than otherwise can be achieved. Also the impedance of the parallel combination of the transformed loads may be higher than the network can accommodate. A common "L" network as is used in the art cannot match into a load whose real part is greater than the source impedance of the generator. The transmission line impedance can be adjusted to some extent by using multiple lines in parallel. When used in this fashion the combination behaves as one transmission line with a characteristic impedance equal to a single line impedance divided by the number of lines.

The present invention also includes the technique of dividing a large active planar electrode in a plasma reactor chamber into an array of smaller, individually powered electrodes located in close proximity so as to form a surface of the desired active area. These smaller plates are fed RF energy from a multitude of ¼ wavelength transmission lines as described above. The advantage of this method is that individual areas of the active electrode surface are constrained to share equal currents thereby negating the well known effect encountered when powering large area electrodes, i.e. the glow discharge tends to be located in certain regions on the electrode while in other regions there is very little if any discharge evident. This results in a non-uniformity of treatment across the extent of the work piece. The effective utilization of segmented electrodes requires that the spacing between adjacent electrode segments be close enough to prevent plasma formation between the electrodes; that is, equal to or less than the dark space gap between two electrodes. Using this method of electrode segmentation, a homogeneous uniform glow discharge is achieved over the entire electrode, even when the total electrode area is much larger than that which would normally support uniform glow discharges. This method in combination with the above described power distribution scheme has the advantage of using a single RF generator and a single moderate power matching network, even power distribution throughout the electrode area, high power efficiency, no requirement for water cooling in the matching and distribution system, ease of assembly with non-critical fabricated parts, simple expandability, and uncomplicated RF shielding requirements. The preferred embodiments of the present invention will now be described with reference to the accompanying drawings.

A typical prior art high frequency RF excited plasma system is shown in FIG. 1. The RF generator 10 is grounded on one side 11 and has a source impedance 12, typically 50 ohms. The grounded plasma chamber 13 consists of a powered electrode 14 and a grounded electrode 15 between which the discharge takes place. The plasma can be electrically modeled as a series capacitor 16 and resistance 17 shown in phantom representing the sheath capacitance and plasma resistance. In order to couple maximum energy into the reactor from the generator, a matching network 18 is used to transform the plasma load up to the generator impedance. With larger electrode surface areas the equivalent plasma resistance 17 is less than 50 ohms and an L type matching network is often used. This consists of an input capacitor 19 and a series inductance 20. The particular implementation and topology of the match network is not important but we will use an L realization here for illustrative purposes.

Figure 2:
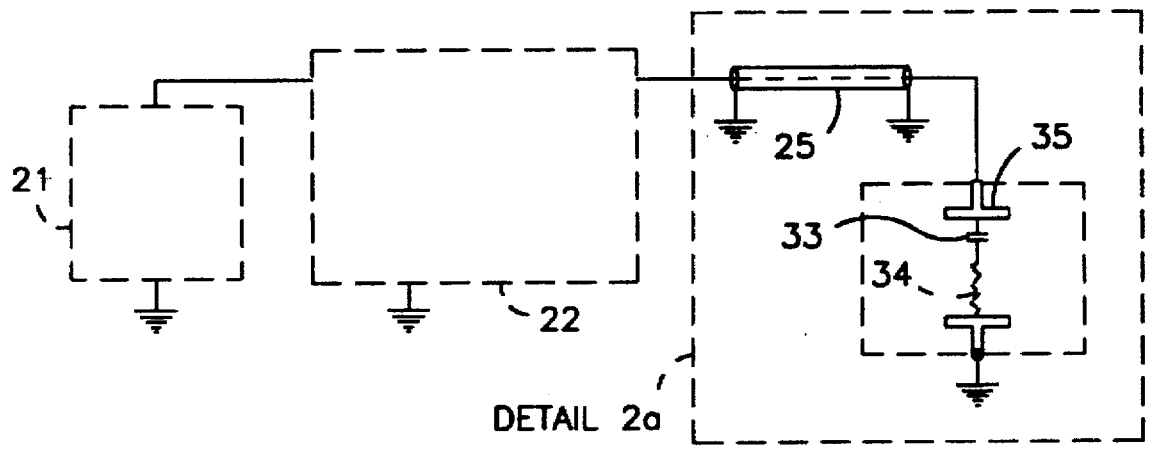
FIG. 2 is used to explain the effect of the ¼ wavelength transmission line on the system impedances.
Figure 3:
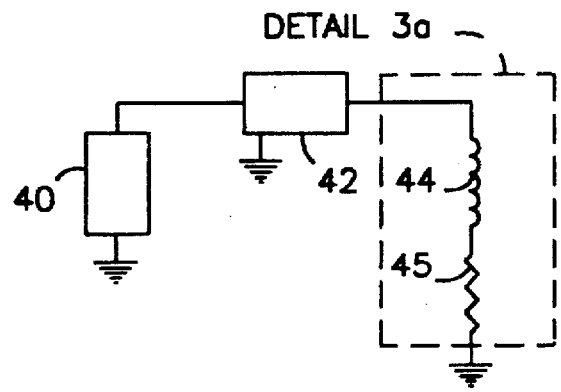
FIG. 3 is an equivalent circuit of Detail 2a of FIG. 2.

FIG. 2 shows the identical system with the addition of a ¼ wavelength section 25 connecting the output of the generator 21, match network 22 and the powered electrode 35. The transforming effect of the ¼ wavelength line 25 is illustrated by replacing the components in Detail 2a with an equivalent circuit; the equivalent circuit is shown in FIG. 3. In this figure the generator 40 is matched by the network 42 for maximum power transfer into an equivalent load of Detail 3a represented by series inductor 44 and resistance 45. Using Eq.2 we can solve for the equivalent resistance 45 as:

$$\frac{Z_{char}^2}{x^2+y^2} x \text{ OR } \frac{Z_{char}^2}{|Z_{load}|^2} x$$

with the symbols having been previously defined. The equivalent reactance 44 is likewise;

$$\frac{Z_{char}^2}{|Z_{load}|^2} y$$

and therefore is inductive since y is a positive quantity. The symbols x and y correspond to the impedance of the resistor 34 and capacitor 33 in Detail 2a. The impedance transformation ratio from the plasma load to the match network output is the square of the ratio of the characteristic impedance of the transmission line to the magnitude of the load impedance. A load of lower impedance than the line will cause an increase in transformed impedance at the match network, and so result in a reduction of current in the network. In some cases the series inductor of match network 42 may need to actually have a negative or capacitive reactance since the transformed load is now inductive. This is easily achieved in a typical network where a tuneable inductor is emulated by a fixed inductor in series with a variable capacitor.

FIG. 4 illustrates a four electrode embodiment of the invention and also demonstrates application of the segmented, large electrode discussed above. The RF power supply 100 feeds the match network 102. The output of the match network 102 feeds four ¼ wavelength coaxial lines 105, 106, 107, and 108 which distribute the power to a segmented electrode comprised of sections 111, 112, 113, and 114 in the grounded plasma chamber 110. The electrodes are closely spaced inside the reactor so as to function as a single large area electrode; that is, the gap 109 between adjacent edges of powered electrodes is equal to or less than the dark space gap. A non-conductive sheet 115 supports and insulates the electrodes from the chamber walls. The coaxial lines' shields are grounded to the chamber at one end and at the match network enclosure at the other. Assuming that the RF power supply generates power at 13.56 MHz, the wavelength thereof would be approximately 72.6 feet in a vacuum. Utilizing RG 217 coaxial cable having a phase velocity reduction of 66%, the length of one full wave within the coaxial cable is approximately 48 feet and the length of a ¼ wavelength transmission line is approximately 12 feet. Utilizing the configuration depicted In FIG. 4, four electrodes, each measuring 17 inches×18 inches are aligned side by side with a gap of approximately 0.1 inches between each electrode, and four 12 foot coaxial transmission lines are connected between the match network and each of the four electrodes. The operational characteristics of this electrode arrangement are such that a uniform plasma is created over the entirety of the combined surface area of the four electrode segments 111, 112, 113 and 114.

FIG. 4a portrays another embodiment of the system shown in FIG. 4 but utilizing DC blocking capacitors 116, 117, 118, and 119 on each electrode to allow each individual electrode to assume its own self-bias potential. It has been found that this helps to prevent abnormal discharge events on the work pieces and chamber walls particularly in the larger sized chambers. Suitable blocking capacitors are low loss, high current RF capacitors in the range of 2,000 to 10,000 picofarads, such as the porcelain capacitor model ATC100E manufactured by American Technical Ceramics Corporation, Huntington Station, N.Y.

The use of multiple cables to obtain a cable of a lower characteristic impedance is shown in FIG. 5. Again the generator 120 is matched to the transformed load by the match network 121. The match network output is fed into a plasma chamber 122 which has a split electrode 123 comprised of sections 124 and 125. Electrode 124 receives power from two equal length lines 126 and 127 in parallel, and electrode 125 is powered by two equal length lines 128 and 129 also in parallel. To create the embodiment depicted in FIG. 5, the detailed embodiment depicted in FIG. 4 and described hereinabove is modified to utilize two 12 foot long coaxial transmission lines that power each of two 17×36 inch electrodes.

Another alternative embodiment is depicted in FIG. 6 in which the generator 130 and match network 131 are configured as before, but the metal reactor chamber 132 is composed of differentially excited electrodes 133 and 134 disposed on insulating plates 135 and 136. The output of the match network 131 drives two coaxial transmission lines, one 137 has a length of ¼ wavelength and the other 138 has a length that is ¾ wavelength long. The length of a ¾ wavelength transmission line is defined herein as being an odd multiple of λ/2 longer than the ¼ wavelength line; that is, line 138 is (2M+1)λ/2 longer than line 137, where M=0,1,2, . . . Since the length of a ¾ wavelength line is included in the set of odd multiples of a ¼ wavelength line, the current sharing and impedance transformation properties are equivalent. However, the extra half wave delay of the ¾ wavelength line causes a 180 degree phase shift which is used to drive the electrodes differentially in this embodiment. Utilizing the specific power supply and components depicted in FIG. 4 and described in detail hereinabove, a particular embodiment as set forth in FIG. 6 utilizes one transmission cable having a length of 12 feet and a second transmission cable having a length of 36 feet, where each cable powers an opposed rectangular electrode measuring 17 inches×18 inches.

When applying standard high frequency (e.g. 13.56 MHz) plasma generation methods to large plasma reactors with comparably sized electrodes (greater than about 30 inches in the longest dimension) it becomes increasingly difficult to obtain uniform plasma distribution across the surface of the electrode. This is due mainly to the effects of standing waves on the electrode surface as its dimensions approach an appreciable fraction of the excitation voltage's wavelength. These standing waves result in uneven voltage distribution along the electrode and, thereby, cause nonuniformity of the plasma.

However, it is possible to achieve an extremely uniform plasma over a large electrode area if a mosaic of smaller, electrically isolated electrodes are substituted for the single large electrode, and if RF energy is then applied equally to each element of the mosaic. FIG. 7 depicts a mosaic comprising six electrically isolated, rectangular electrodes 140, each having a power transmission line 142 engaged thereto. These electrodes 140 are disposed on an insulating surface 145 and are arranged as tiles in one or two dimensions depending on the size and shape desired for the application (two dimensions are depicted in FIG. 7). The edges of adjacent electrodes 140 are located within the dark space gap 144 (about 0.1 inch) of each other, so as to preclude an enhancement of the glow discharge in the gaps 144, as this would be detrimental to glow uniformity. If each electrode 140 is of equal area, as shown in FIG. 7, equal power should be distributed to every electrode in order to realize maximum plasma homogeneity. Techniques such as the ¼ wavelength transmission line distribution system described here or Rough's balun scheme as described in patent U.S. Pat. No. 4,887,005 can be utilized to meet this requirement for equally powered electrodes. Electrode shapes such as triangular, square and hexagonal are also within the scope of this invention.

In addition, it is foreseen that there may be uses for unequally sized electrodes 140 for specific applications. In this case it is only required that the power delivered to each individual electrode 140 is scaled with that electrode's area, and that the largest electrode dimensions remain much less than a wavelength. The power distribution techniques mentioned above in regard to FIG. 5 can be utilized for power distribution to the different sized electrodes.

While it is most desirable to utilize a transmission line having an electrical length of a ¼ wavelength line, due to cable losses and other parameters which lead away from the theoretical ideal, it is often impossible to know beforehand exactly what length of transmission line will most precisely achieve this length. Experimentation to determine the length of a particular type or brand of cable (having particular losses, etc., associated with its specific materials, dimensions and other parameters) that constitutes a ¼ wavelength transmission line (experimentally determined length) is the preferred method to arrive at the optimal result. It is the inventor's experience that a transmission line length variation of not more than 5% from the experimentally determined length will provide acceptably uniform plasmas with acceptable power requirements, and that significantly improved results are achieved with a line length variation of not more than 2%.

While the invention has been particularly shown and described with reference to certain preferred embodiments, it will be understood by those skilled in the art that various alterations and modifications in form and detail may be made therein. Accordingly, it is intended that the following claims cover all such alterations and modifications as may fall within the true spirit and scope of the invention.

What I claim is:

1. A multiple electrode plasma reactor comprising:

a reactor chamber;

an RF generator;

an electrical matching network connected to the RF generator;

two or more powered electrodes being disposed within said reactor chamber;

at least one separate transmission line being connected to said matching network and to each said powered electrode, each said transmission line having a length approximately equal to a ¼ wavelength transmission line.

2. A multiple electrode plasma reactor as described in claim 1 wherein two or more of said transmission lines are connected in parallel to at least one said electrode.

3. A multiple electrode plasma reactor as described in claim 1 wherein the length of each said transmission line is within 5% of an experimentally determined length of a ¼ wavelength transmission line.

4. A multiple electrode plasma reactor as described in claim 1 wherein the length of each said transmission line is within 2% of an experimentally determined length of a ¼ wavelength transmission line.

5. A multiple electrode plasma reactor as described in claim 1 wherein at least one of said transmission lines has a length equal to a ¼ wavelength line and at least one of said transmission lines have a length equal to a ¾ wavelength transmission line, such that the voltage is 180° out of phase in opposed pairs of said electrodes, so as to differentially excite the plasma between said opposed electrodes.

6. A multiple electrode plasma reactor as described in claim 5 wherein two or more of said transmission lines are connected in parallel to at least one said electrode.

7. A multiple electrode plasma reactor as described in claim 1 wherein at least two of said electrodes are connected electrically in parallel, are closely spaced inside the reactor so as to function as a single large area having a uniform plasma over the surface of the area, and are separated by a gap that is small enough to inhibit the formation of a plasma between said electrodes.

* * * * *